(12) United States Patent
Zimoch

(10) Patent No.: US 12,506,396 B2
(45) Date of Patent: Dec. 23, 2025

(54) HALF-BRIDGE CONVERTER COMPRISING A BOOTSTRAP CIRCUIT TO PROVIDE A NEGATIVE TURN-OFF VOLTAGE

(71) Applicant: ETEL S.A., Motiers (CH)

(72) Inventor: Piotr Zimoch, Scherz (CH)

(73) Assignee: ETEL S.A., Motiers (CH)

( * ) Notice: Subject to any disclaimer, the term of this patent is extended or adjusted under 35 U.S.C. 154(b) by 197 days.

(21) Appl. No.: 18/401,740

(22) Filed: Jan. 2, 2024

(65) Prior Publication Data

US 2024/0235385 A1 Jul. 11, 2024

(30) Foreign Application Priority Data

Jan. 5, 2023 (EP) .................................... 23150398

(51) Int. Cl.
| | |
|---|---|
| *H02M 3/158* | (2006.01) |
| *H02M 1/00* | (2006.01) |
| *H02M 3/00* | (2006.01) |
| *H03K 17/06* | (2006.01) |

(52) U.S. Cl.
CPC ......... *H02M 1/0006* (2021.05); *H02M 3/005* (2013.01); *H02M 3/158* (2013.01); *H03K 17/063* (2013.01); *H03K 2217/0063* (2013.01); *H03K 2217/0072* (2013.01)

(58) Field of Classification Search
CPC ...... H02M 1/0006; H02M 1/08; H02M 3/156; H02M 3/158; H02M 3/005; H02M 1/38
See application file for complete search history.

(56) References Cited

U.S. PATENT DOCUMENTS 9,209,793 B2 12/2015 Lee et al.
2011/0121884 A1 5/2011 Mazzola et al.
(Continued)

FOREIGN PATENT DOCUMENTS

CN 115459755 A 12/2022

OTHER PUBLICATIONS

Lin et al., Power-Factor Correction Using Cuk Converters in Discontinuous-Capacitor-Voltage Mode Operation, IEEE Transactions on Industrial Electronics; Oct. 1997, pp. 648-653, vol. 44 No. 5, IEEE, ISSN: 0278-0046, USA.
(Continued)

*Primary Examiner* — Alex Torres-Rivera
(74) *Attorney, Agent, or Firm* — LEYDIG, VOIT & MAYER, LTD.

(57) ABSTRACT

A half-bridge converter includes a high-side transistor connected to a positive electrode of a direct current (DC) voltage source and a low-side transistor connected to a reference ground. A gate driver is configured to control the high-side and low-side transistors at a duty cycle of a gate driver control signal. A bootstrap circuit is configured to provide a positive voltage and a negative voltage to the gate driver for the high-side transistor. The bootstrap circuit comprises a first diode, a first capacitor and a Cuk converter. The Cuk converter comprises a first and a second inductor, a switch, a first and a second capacitor and a second diode to output the negative voltage to the high-side transistor gate driver. The Cuk converter is configured to output the negative voltage when operating in a Discontinuous Voltage Mode (DVM).

6 Claims, 5 Drawing Sheets

(56) References Cited

U.S. PATENT DOCUMENTS

2013/0214757 A1* 8/2013 Lee .................. H03K 17/06
323/311
2022/0158552 A1* 5/2022 Rana .................. H02M 1/0006
2023/0078379 A1* 3/2023 Kulsangcharoen ..... H02M 1/08
327/390

OTHER PUBLICATIONS

Cuk, General Topological Properties of Switching Structures, Proceedings of the Annual Power Electronics Specialists Conference, 1979, pp. 109-130, IEEE, USA.

Maksimovic et al., A Unified Analysis of PWM Converters in Discontinuous Modes, IEEE Transactions on Power Electronics, Jul. 1991, pp. 476-490, vol. 6, No. 3, IEEE, DOI: 10.1109/63.85890.

* cited by examiner

HALF-BRIDGE CONVERTER COMPRISING A BOOTSTRAP CIRCUIT TO PROVIDE A NEGATIVE TURN-OFF VOLTAGE

CROSS REFERENCE TO RELATED APPLICATIONS

This application claims benefit to European Patent Application No. EP 23150398.8, filed on Jan. 5, 2023, which is hereby incorporated by reference herein.

FIELD

The present invention relates to a half-bridge converter comprising a bootstrap circuit for controlling semiconductor switches, such as insulated-gate bipolar transistors (IGBTs) or metal-oxide-semiconductor field-effect transistor (MOSFETs). More particularly, the bootstrap circuit comprises a Cuk converter configured to be used in a Discontinuous Voltage Mode (DVM) to apply a negative voltage for turning off the high-side transistor of the half-bridge converter.

BACKGROUND

Transistors used as power switches, such as IGBTs or MOSFETs, in a half-bridge converter for switching high currents at high voltages are commonly used particularly in Switched Mode Power Supplies (SMPS) or motor drives. Control of the voltage at the gate of the high-side transistor of the half-bridge may be achieved by a bootstrap circuit comprising a diode and a capacitor.

There is however a high increase of voltage occurring when applying a turn-off voltage to the high-side transistor of the half-bridge when using conventional bootstrap circuit, which may lead to what is known as parasitic turn-on caused by the Miller effect. Parasitic turn-on often leads to the destruction of IGBTs or MOSFETs, as the gate-emitter voltage of the IGBT or the gate-source voltage of the MOSFET rises and reaches a threshold voltage when turned-off, causing a shoot-through event that increases power loss in the circuit. This problem is emphasized when using silicon carbide transistors due to their very short switching times.

It is known to provide negative voltage to turn-off the high-side transistor of a half-bridge converter to prevent parasitic turn-on issues.

U.S. Pat. No. 9,209,793B2 discloses a bootstrap circuit for providing a drive voltage to high-side transistor of a half-bridge converter. The bootstrap circuit comprises a buck-boost circuit configured to provide a negative drive voltage for turning the high-side transistor off via a negative supply node. The buck-boost circuit comprises a first capacitor coupled between an output node of the half-bridge and the negative supply node, an inductor having a first terminal coupled to the output node of the half-bridge, and a diode coupled between a second terminal of the inductor and the negative supply node. This buck-boost circuit significantly reduces the risk of an unintended parasitic turn-on.

An inconvenient of this bootstrap circuit lies in the value of the negative drive which is dependent of the half-bridge duty cycle while the duty cycle changes in most applications of half-bridge converters, particularly in motor control. In some cases, this may damage the gate of the high-side transistor when the maximum rating is exceeded. To address this issue, the circuit disclosed in U.S. Pat. No. 9,209,793B2 comprises a Zener diode to limit the voltage swings at the gate of the high-side transistor at the expense of power loss.

SUMMARY

In an embodiment, the present invention provides a half-bridge converter, which includes a high-side transistor connected to a positive electrode of a direct current (DC) voltage source and a low-side transistor connected to a reference ground. A gate driver is configured to control the high-side and low-side transistors at a duty cycle of a gate driver control signal. A bootstrap circuit is configured to provide a positive voltage and a negative voltage to the gate driver for the high-side transistor. The bootstrap circuit comprises a first diode, a first capacitor and a Cuk converter. The Cuk converter comprises a first and a second inductor, a switch, a first and a second capacitor and a second diode to output the negative voltage to the high-side transistor gate driver. A value of inductance of the first and second inductors and a value of capacitance of the first capacitor of the Cuk converter are set such that the Cuk converter is configured to output the negative voltage when operating in a Discontinuous Voltage Mode (DVM).

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 3 shows an equivalent circuit of the Cuk converter of FIG. 2 in a continuous conduction mode (CCM) when the transistor of the Cuk converter is on;

DETAILED DESCRIPTION

Figure 1:
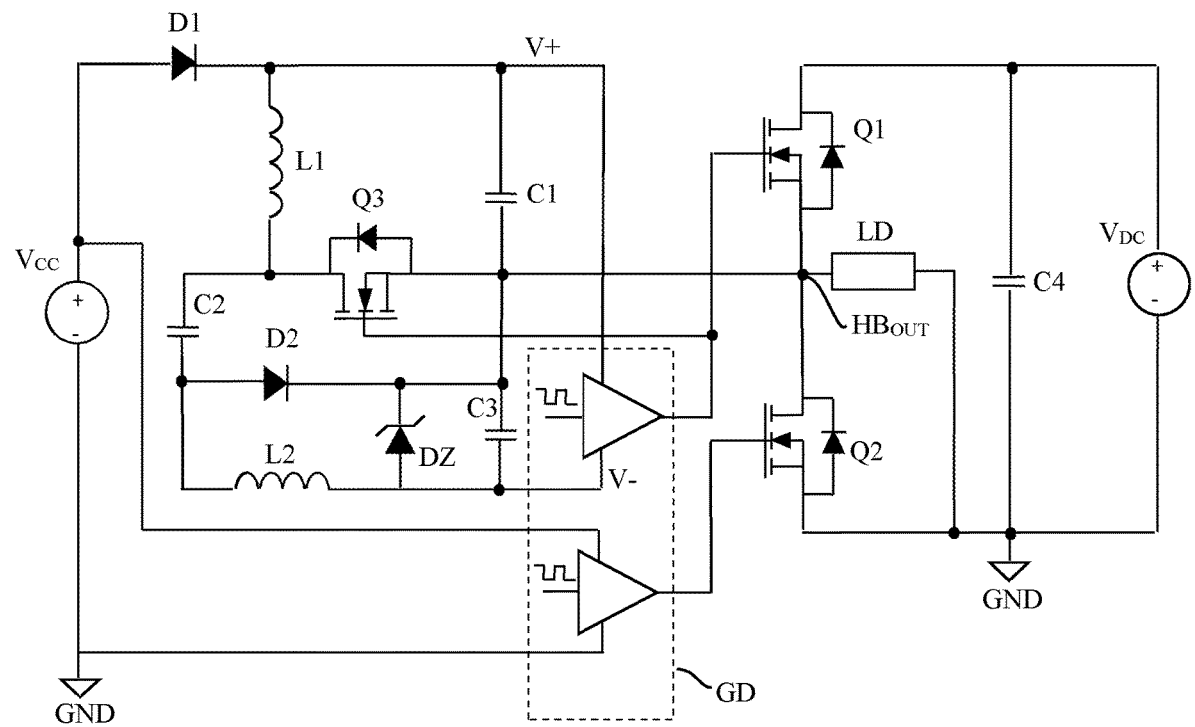
FIG. 1 shows a circuit diagram of a half-bridge converter comprising a bootstrap circuit with a Cuk converter to generate a negative voltage to turn-off the high-side transistor of the half-bridge converter, according to an embodiment.

In an embodiment, the present invention provides a half-bridge converter comprising a bootstrap circuit for controlling voltage to the gate of the high-side transistor with a negative turn-off voltage which is less dependent on the half-bridge duty cycle.

A half-bridge converter comprising a bootstrap circuit for controlling voltage to the gate of the high-side transistor with a negative turn-off voltage which is less dependent on the half-bridge duty cycle is achieved according to an embodiment of the present invention by means of a half-bridge converter comprising a high-side transistor connected to the positive electrode of a DC voltage source, a low-side transistor connected to a reference ground, a gate driver for controlling the high-side and low-side transistors at a duty cycle of the gate driver control signal, and a bootstrap circuit for providing a positive voltage and a negative voltage to the high-side transistor gate driver. The bootstrap circuit comprises a first diode, a first capacitor and a Cuk converter. The Cuk converter comprises a first and a second inductor, a switch, a first and a second capacitor and a diode to output the negative voltage to the high-side transistor gate driver. The value of the inductance of the first and second inductors and the value of the capacitance of the first capacitor of the Cuk converter are set such that the Cuk converter is configured to output said negative voltage when operating in a Discontinuous Voltage Mode (DVM).

More particularly, the ratio of the negative voltage to the positive voltage when the Cuk converter operates in DVM is expressed by the following equation:

$$\frac{V_-}{V_+} = \frac{-\sqrt{2RCf}}{1-D}$$

where R is the load resistance, C is the first capacitor of the Cuk converter, f is the switching frequency and D is the duty cycle of the gate driver control signal.

In an embodiment, the half-bridge converter is configured such that the Cuk converter when operating uses the high-side transistor as the switch.

In an embodiment, the half-bridge converter further comprises an additional diode arranged to protect the bootstrap circuit from the voltage provided by the DC voltage source.

In an embodiment, the half-bridge converter further comprises a resistance connected in series with the first inductor of the Cuk converter. The value of the resistance is preferably above 100Ω, more preferably above 150Ω, for example 200Ω.

In an embodiment, the half-bridge converter further comprise a Zener diode arranged in parallel to the second capacitor of the Cuk converter to limit the amplitude of the negative voltage.

With reference to FIGS. 1 to 5, the half-bridge converter comprises a high-side transistor Q1 and a low-side transistor Q2 which may be MOSFET or IGBT transistors. The source/emitter of the high-side transistor Q1 is connected to the drain/collector of the low-side transistor Q2 thereby forming a floating connection point $HB_{OUT}$.

The drain/collector of the high-side transistor Q1 is connected to the positive electrode of a DC voltage source $V_{DC}$ and the source/emitter of the low-side transistor Q2 is connected to the negative electrode of the voltage source $V_{DC}$. $V_{DC}$ is the DC bus voltage while $V_{CC}$ is the low side gate supply voltage. A typical value of voltage $V_{CC}$ is 15V.

A gate driver GD is configured to provide to the gate of both transistors Q1, Q2 pulse width modulated signals of opposite phase to alternatively couple the connection point $HB_{OUT}$ to the positive and negative electrode of the voltage source $V_{DC}$. The connection point $HB_{OUT}$ can therefore be connected to a load LD to supply to the load an alternating switching voltage, whereby the voltage at the connection point $HB_{OUT}$ switches between reference ground GND and the voltage of the DC voltage source $V_{DC}$. The half-bridge converter further comprises a capacitance C4 of a typical value of 1000 µF for smoothing the voltage provided to the load LD.

The half-bridge converter of FIG. 1 further comprises a bootstrap circuit comprising a diode D1 and a capacitor C1 of a typical value of 1 µF to provide floating voltages referred to the connection point $HB_{OUT}$ of the half-bridge. The bootstrap circuit further comprises a Cuk converter, whose operating modes will be explained hereafter.

The Cuk converter comprises a first and a second inductor L1, L2, a first and a second capacitors C2, C3, a diode D2 and a transistor Q3 acting as a switch between two operating modes of the Cuk converter. Typical values for the first and second inductors L1, L2 may be respectively 8.2 mH and 2.2 mH while typical values for the first and second capacitors C2, C3 may be respectively 4.7 nF and 1 µF. These values are valid for a switching frequency of the order of 20 KHz.

Figure 2:
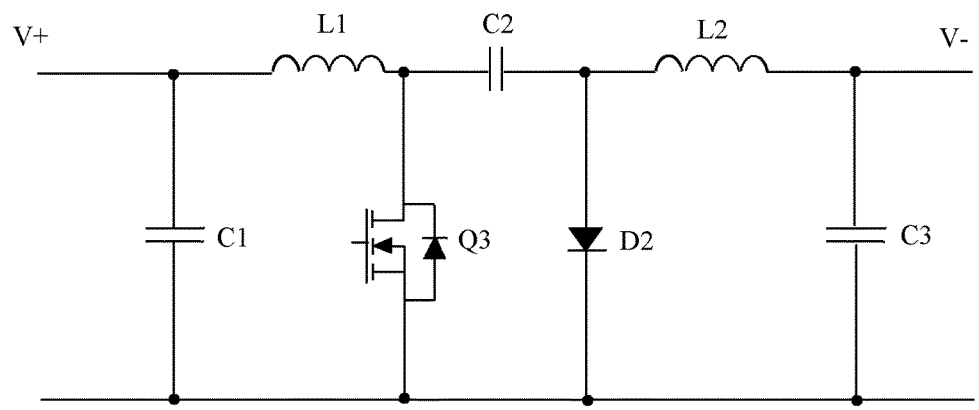
FIG. 2 shows a circuit diagram of the Cuk converter of FIG. 1.
Figure 3:
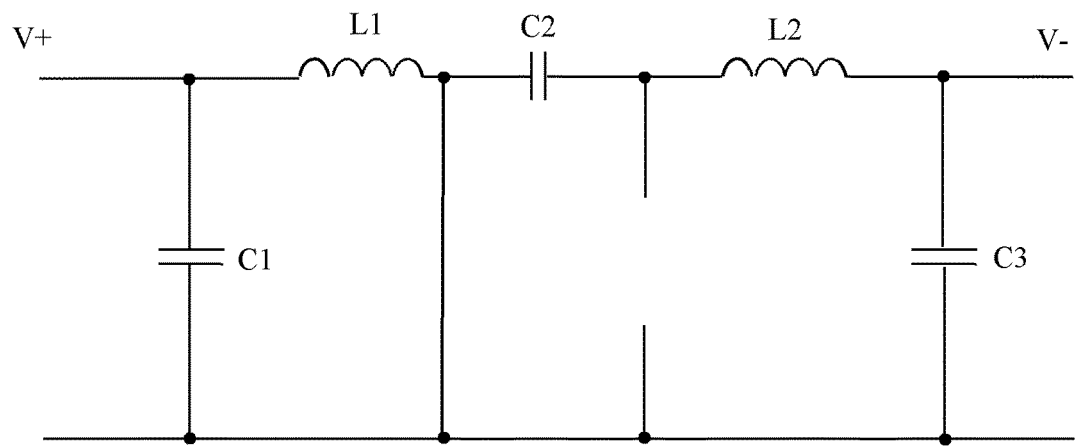

The Cuk converter, as shown in FIG. 2, is conventionally used to operate in continuous conduction mode (CCM). FIG. 3 is the equivalent circuit of FIG. 2 when the transistor Q3 is on, whereby the first inductor L1 is energized with positive current by the positive voltage V+, through the transistor. At the same time the second inductor L2 and the first capacitor C2 are connected in series and inductor L2 is being energized with negative current with the energy that had been stored in capacitor C2.

Figure 4:
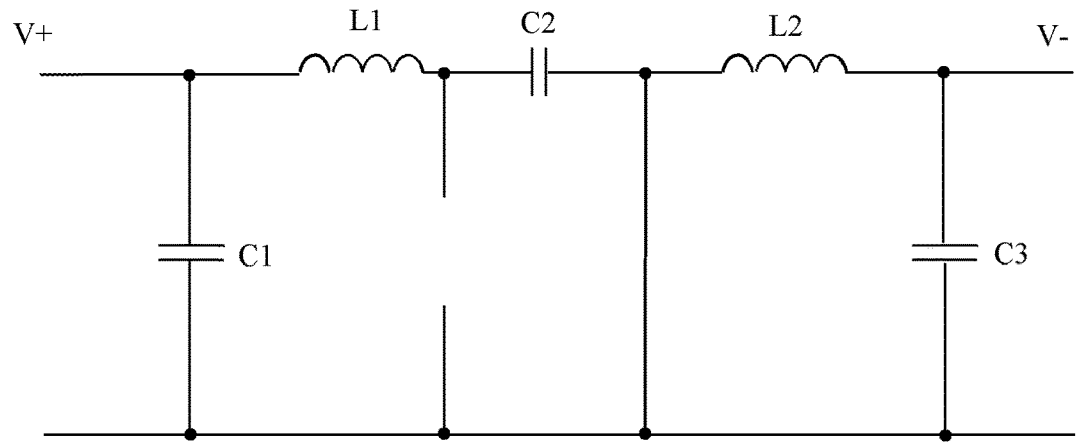
FIG. 4 shows an equivalent circuit of the Cuk converter of FIG. 2 in CCM when the transistor of the Cuk converter is off.

FIG. 4 is the equivalent circuit of FIG. 2 when the transistor Q3 is off, whereby the second inductor L2 is connected to the output through diode D2, discharging the energy that it was energized with when the transistor was on. Capacitor C3 is connected to the output to smooth the voltage at this point. At the same time, the first inductor L1 and the first capacitor C2 are connected in series. The first inductor L1 deenergizes, charging capacitor C2 with the energy which will later again be used to charge the second inductor L2. Therefore, during operation of the Cuk converter, the first and second inductors L1, L2 are used to convert the positive and negative voltages, respectively, into current sources, while the first capacitor C2 acts as an intermediate step between them to transfer energy, while transistor Q3 and diode D2 switch to change between the two states of charging and discharging the capacitor C2.

When the Cuk converter operates in CCM neither the currents of the first and second inductors L1, L2 nor the voltage of the first capacitor C2 ever drop to zero. In this mode of operation, the ratio of the negative voltage to the positive voltage is equal to:

$$\frac{V_-}{V_+} = \frac{-D}{1-D} \qquad (1)$$

where D is the duty cycle of the transistor's control signal.

Figure 5:
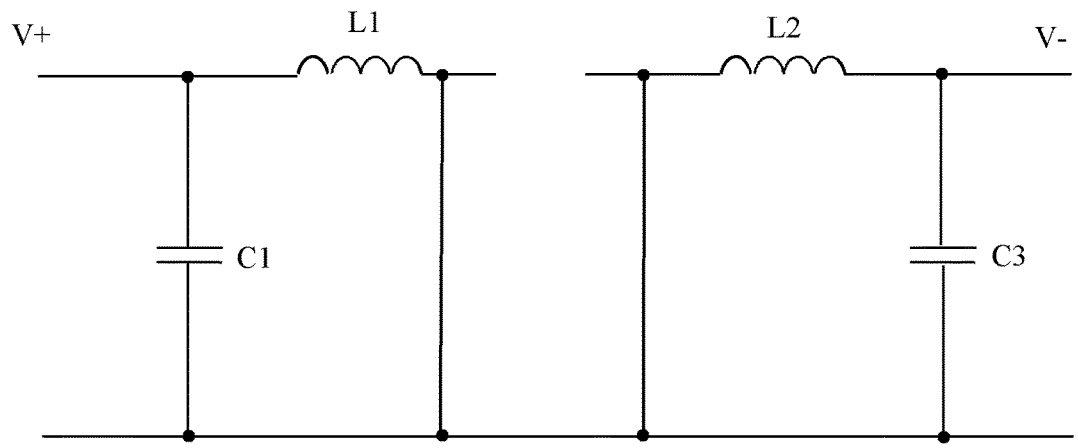
FIG. 5 shows the equivalent circuit of the Cuk converter of FIG. 2 when operating in a discontinuous voltage mode (DVM)

However, when the inductance of the first and second inductors L1, L2 are sufficiently large to keep their currents non-zero, while the first capacitor C2 is so small that its voltage can drop to zero, the Cuk converter enters into what is known as a Discontinuous Voltage Mode (DVM). The equivalent circuit of this mode of operation is shown in FIG. 5.

At first, when the transistor Q3 is on, the Cuk converter operates like in CCM as per the equivalent circuit of FIG. 3. The first inductor L1 is charged with positive current by the positive voltage V+ through the transistor Q3. In the CCM, the second inductor L2 and the first capacitor C2 are connected in series. The second inductor L2 is therefore being energized with the energy that had been stored in the first capacitor C2. While the transistor is still on, the first capacitor C2 fully discharges, and its voltage drops to zero to operate as per the equivalent circuit of FIG. 5.

This causes the diode D2 to turn on to conduct the second inductor L2's current, which now draws current from the output of the converter. When transistor Q3 is switched off, the equivalent circuit again looks like the one in FIG. 4. The second inductor L2 is connected to the output through diode D2, discharging the energy that it was energized with when the transistor was on. At the same time the first inductor L1 and the first capacitor C2 are connected in series. Inductor L1 deenergizes, charging capacitor C2 with the energy which will later again be used to charge inductor L2. In DVM, the ratio of the negative voltage V− to the positive voltage V+ changes to:

$$\frac{V_-}{V_+} = \frac{-\sqrt{2RCf}}{1-D} \quad (2)$$

where R is the load resistance, C is the capacitance of the first capacitor C2 of the Cuk converter, f is the switching frequency and D is the duty cycle of transistor's control signal. A complete derivation of the above equation is given in the publication entitled "*Power-factor correction using Cuk converters in discontinuous-capacitor-voltage mode operation*" published in October 1997 in IEEE Transactions on Industrial Electronic (Volume: 44, Issue: 5, pages 648-653; Authors: Bo-Tao Lin; Yim-Shu Lee).

When comparing the formula (1) which applies for CCM with formula (2) which applies for DVM, the Cuk converter operating in DVM is less dependent on the duty cycle of the transistor Q3, particularly for values of D between 20% and about 80%.

With reference to FIG. 1, the first and second inductors L1, L2, the capacitors C2, C3, the transistor Q3 and the diode D2 are simply parts of the Cuk converter described in relation to FIGS. 2 to 5. In this case, they are applied in such a way to use the voltage across C1 as the input voltage to convert it to a negative voltage across the second capacitor C3 of the Cuk converter. A Zener diode DZ is arranged in parallel to the second capacitor C3 to limit the amplitude of the negative voltage V−. The operation of the circuit is as follows.

When the low-side transistor Q2 of the half-bridge is switched on, it creates a conduction path for current flowing from the voltage source supplying the voltage $V_{CC}$, through diode D1, charging capacitor C1 up to the value of the positive voltage V+. Diode D1 and capacitor C1 are parts of a state-of-the-art classic bootstrap circuit. Capacitance of capacitor C1 is assumed to be sufficiently large to keep the positive voltage V+ constant once charged. The positive voltage V+ is then used to supply the gate driver of the high-side transistor Q1, to turn it on as the low-side transistor Q2 is turned off.

Figure 6:
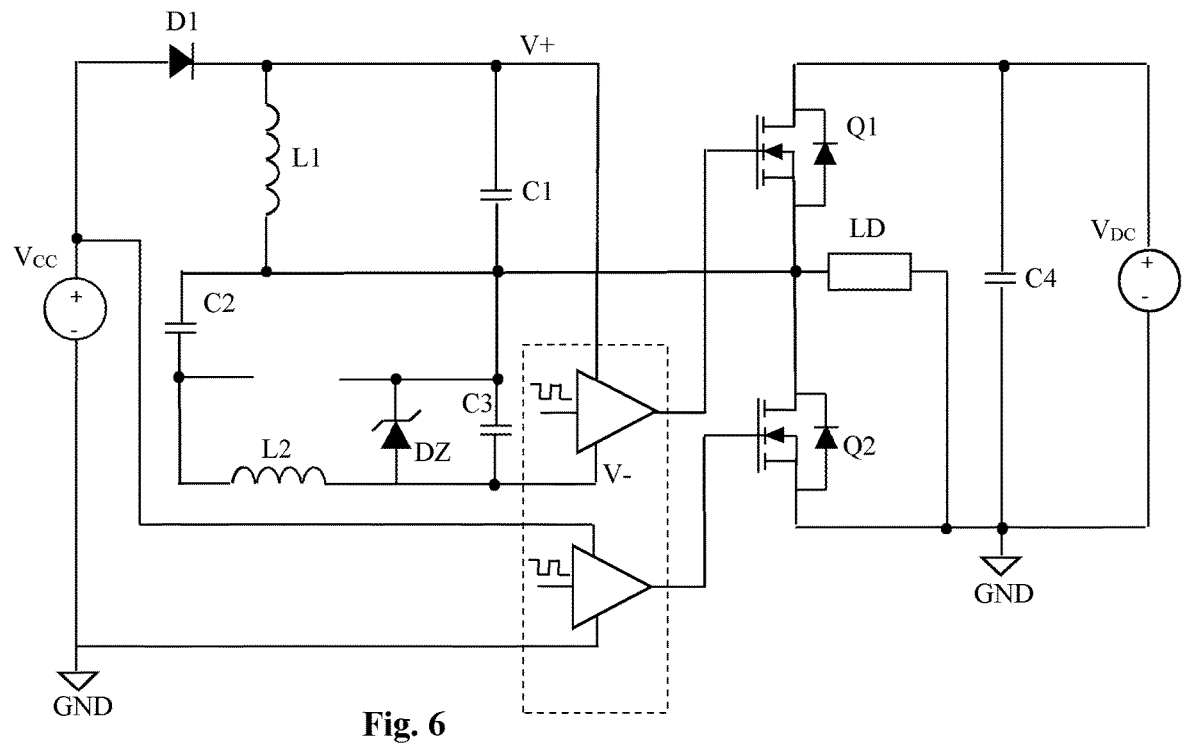
FIG. 6 shows the equivalent circuit of FIG. 1 when the transistor of the Cuk converter is on and operates in CCM.

Once C1 is charged to input voltage $V_{CC}$, the operation of the Cuk converter is as described above. At first, when the transistor Q3 is on, the converter operates in CCM as per the equivalent circuit of FIG. 6. The first inductor L1 is energized with positive current by the positive voltage V+, through the transistor Q3. At the same time the second inductor L2 and the capacitor C2 are connected in series and inductor L2 is being energized with the energy that had been stored in capacitor C2. However, while the transistor is still on, capacitor C2 fully discharges, and its voltage drops to zero.

Figure 7:
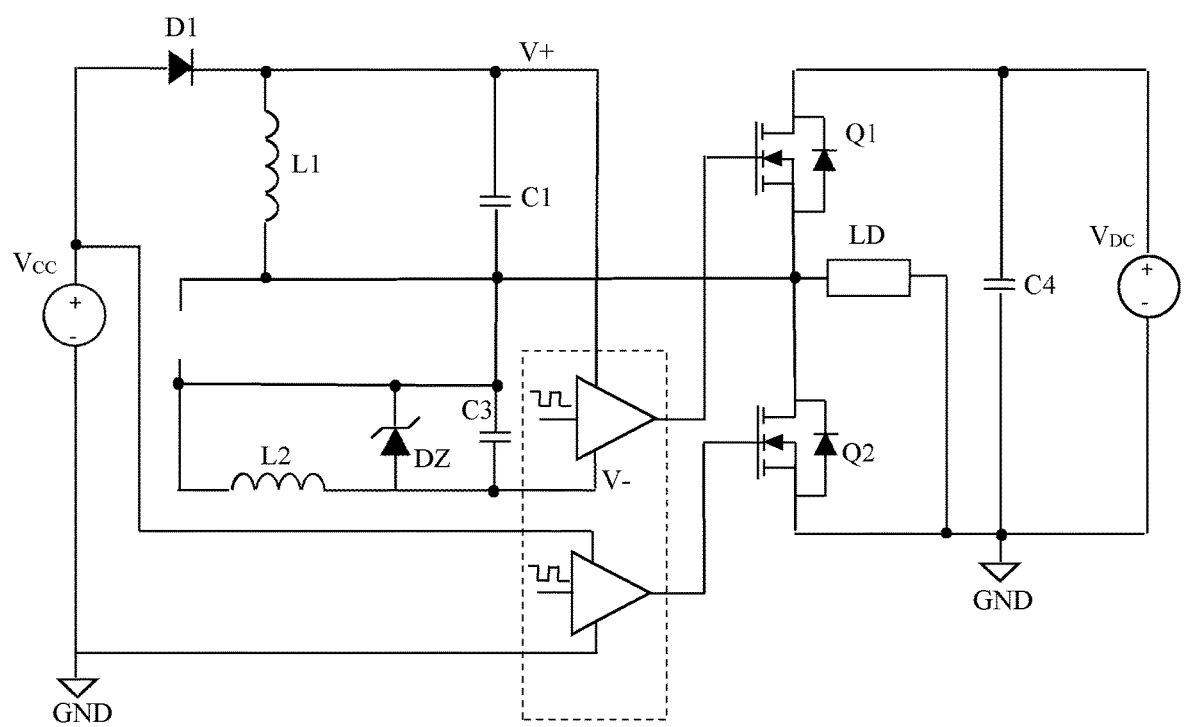
FIG. 7 shows the equivalent circuit of FIG. 1 when the transistor of the Cuk converter is still on but the voltage of the first capacitor has dropped to zero, whereupon the Cuk converter operates in DVM.
Figure 8:
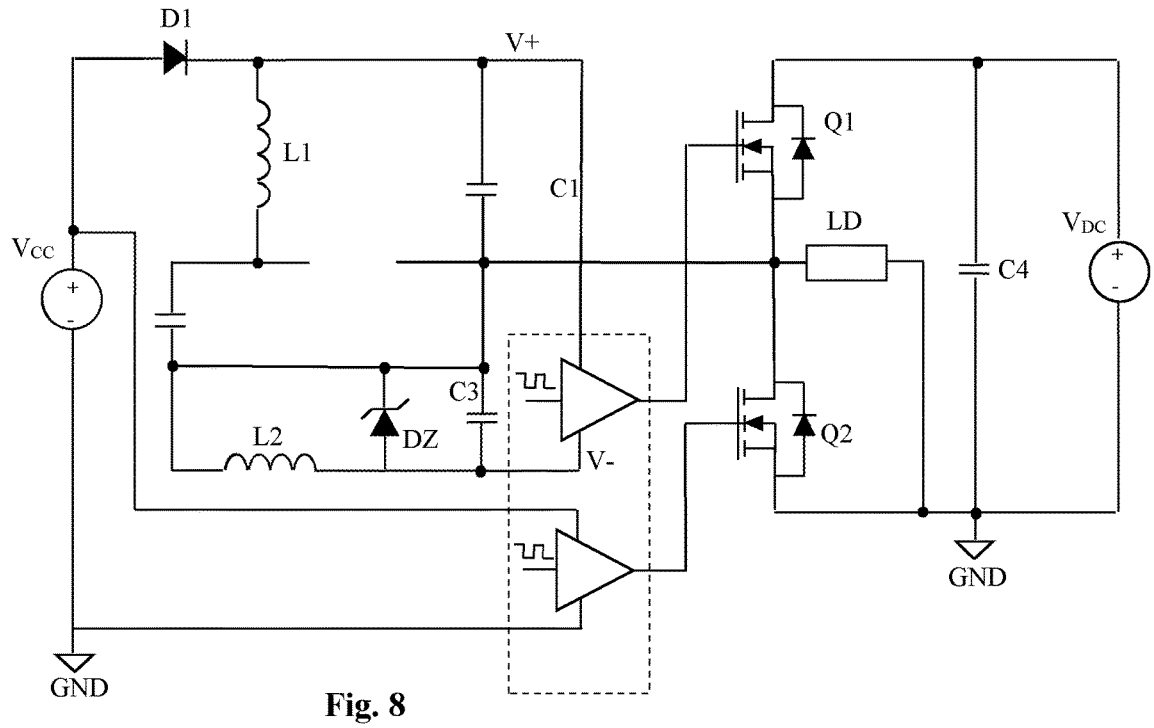
FIG. 8 shows the equivalent circuit of FIG. 1 when the transistor of the Cuk converter is off.

An equivalent circuit of this operation state is shown in FIG. 7. This causes the diode D2 to turn on to conduct inductor L2's current, which now starts drawing current from the output of the converter. When transistor Q3 is switched off, the equivalent circuit is shown in FIG. 8. The second inductor L2 is connected to the output through the diode D2, discharging the energy that it was energized with when the transistor was on. At the same time the first inductor L1 and capacitor C2 are connected in series. Inductor L1 deenergizes, charging capacitor C2 with the energy which will later again be used to energize inductor L2.

The circuit converts the positive voltage V+ to a negative output voltage V−, such that the ratio of the negative voltage to the positive voltage is equal to:

$$\frac{V_-}{V_+} = \frac{-\sqrt{2RCf}}{1-D}$$

This negative output voltage V− is then used to supply the gate driver of the high-side transistor Q1, to turn it off as the low-side transistor Q2 is turned on.

Figure 9:
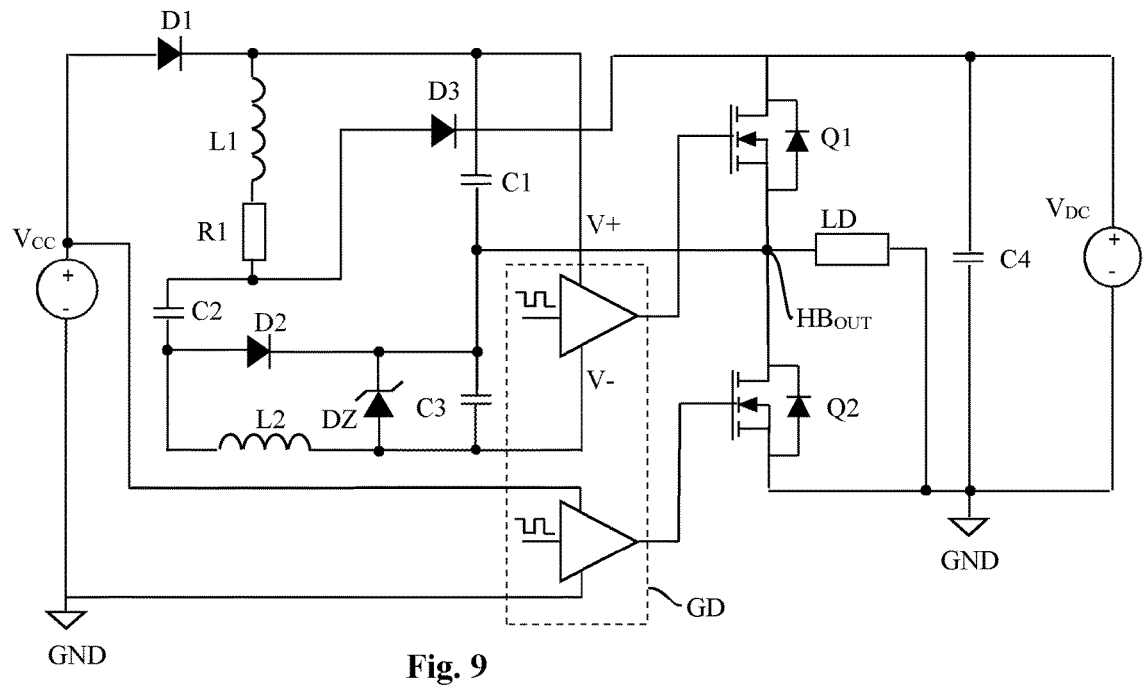
FIG. 9 shows a circuit diagram similar to the circuit diagram of the half-bridge converter of FIG. 1, wherein the Cuk converter is adapted to use the high-side transistor of the half-bridge to switch its operating state, according to another embodiment.
Figure 10:
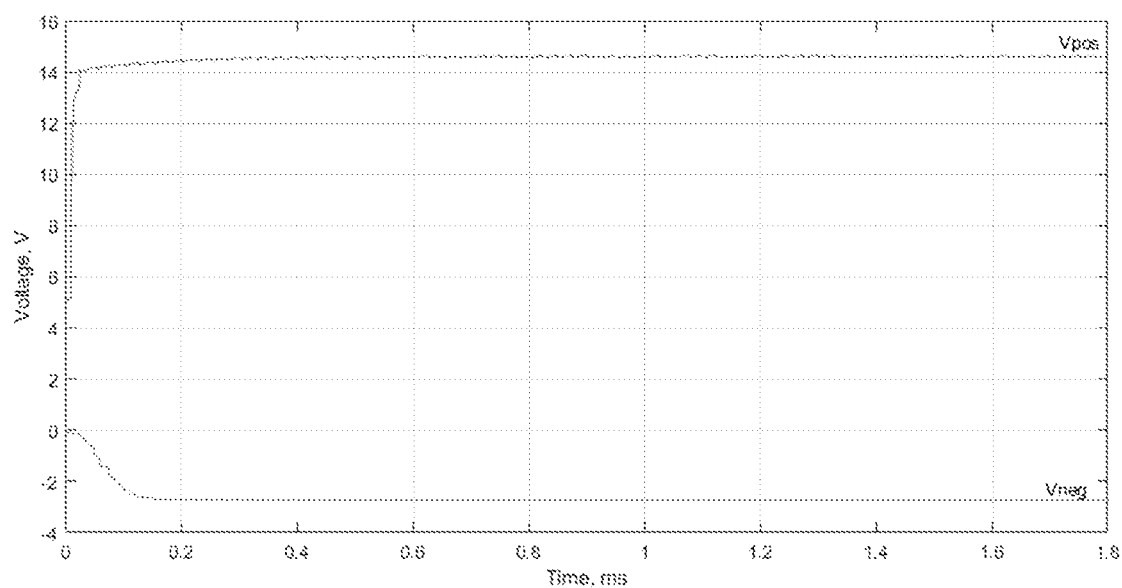
FIG. 10 shows an example of waveforms of the positive voltage V+ and the negative voltage V− provided by the circuit of FIG. 1 operating in DVM.

In an advantageous embodiment illustrated in FIG. 9, the half-bridge of FIG. 1 is modified by removing the transistor Q3 and using the high-side transistor Q1 of the half-bridge to switch states of the Cuk converter. In this case, an additional diode D3 is added the circuit to protect the bootstrap circuitry from the high voltage of DC voltage source $V_{DC}$. Typical values of the first and second inductances L1, L2 and of capacitors C2, C3 remain the same as those mentioned with respect to the embodiment of FIG. 1.

The main advantage of this embodiment is to economize one transistor, thus reducing the cost of the circuit. The description of the circuit's operation remains the same as above, but Q1 is used instead of Q3.

Another variant is shown in FIG. 9, where a resistor R1 is added in series with the first inductor L1 of the Cuk converter. The value of resistor R1 may be typically equal to 200Ω. However, nothing changes in the above description of circuit operation. The resistor R1 only acts to limit the amount of energy that first inductor L1 is energized with, thus lowering the value of the negative voltage V−. This can be useful at high values of duty cycle.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A half-bridge converter, comprising:
a high-side transistor connected to a positive electrode of a direct current (DC) voltage source;
a low-side transistor connected to a reference ground;
a gate driver configured to control the high-side and low-side transistors at a duty cycle of a gate driver control signal; and
a bootstrap circuit configured to provide a positive voltage and a negative voltage to the gate driver for the high-side transistor, the bootstrap circuit comprising a first diode, a first capacitor and a Cuk converter, the Cuk converter comprising a first and a second inductor, a switch, a first and a second capacitor and a second diode to output the negative voltage to the high-side transistor gate driver, wherein a value of inductance of the first and second inductors and a value of capacitance of the first capacitor of the Cuk converter are set such that the Cuk converter is configured to output the negative voltage when operating in a Discontinuous Voltage Mode (DVM).

2. The half-bridge converter according to claim 1, wherein a ratio of the negative voltage to the positive voltage when the Cuk converter operates in DVM is expressed by the following equation:

$$\frac{V_-}{V_+} = \frac{-\sqrt{2RCf}}{1-D}$$

where R is load resistance, C is a capacitance of the first capacitor of the Cuk converter, f is switching frequency and D is the duty cycle of the gate driver control signal.

3. The half-bridge converter according to claim 1, configured such that the Cuk converter when operating uses the high-side transistor as the switch.

4. The half-bridge converter of claim 1, further comprising an additional diode arranged to protect the bootstrap circuit from a voltage of a low side gate supply voltage source.

5. The half-bridge converter according to claim 1, further comprising a resistor connected in series with the first inductor of the Cuk converter, a value of resistance being above 100Ω.

6. The half-bridge converter according to claim 1, further comprising a Zener diode disposed in parallel to the second capacitor of the Cuk converter to limit an amplitude of the negative voltage.

* * * * *